United States Patent
She et al.

(10) Patent No.: US 11,609,282 B2
(45) Date of Patent: Mar. 21, 2023

(54) CHIP-TYPE THREE-DIMENSIONAL MAGNETIC FIELD SENSOR

(71) Applicant: Zhejiang University, Zhejiang (CN)

(72) Inventors: Xuan She, Zhejiang (CN); Junjie Yao, Zhejiang (CN); Kan Chen, Zhejiang (CN); Tengchao Huang, Zhejiang (CN); Xiaowu Shu, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 0 days.

(21) Appl. No.: 17/611,140

(22) PCT Filed: Apr. 22, 2020

(86) PCT No.: PCT/CN2020/086127
§ 371 (c)(1),
(2) Date: Nov. 13, 2021

(87) PCT Pub. No.: WO2020/228498
PCT Pub. Date: Nov. 19, 2020

(65) Prior Publication Data
US 2022/0221530 A1    Jul. 14, 2022

(30) Foreign Application Priority Data

May 13, 2019  (CN) .......................... 201910391741.X

(51) Int. Cl.
*G01R 33/032* (2006.01)
*G01R 33/02* (2006.01)

(52) U.S. Cl.
CPC ..... *G01R 33/0322* (2013.01); *G01R 33/0206* (2013.01)

(58) Field of Classification Search
CPC .............. G01R 33/0322; G01R 33/032; G01R 33/0206
(Continued)

(56) References Cited

U.S. PATENT DOCUMENTS 5,696,858 A * 12/1997 Blake ................. G01R 33/0322
385/12
5,987,195 A * 11/1999 Blake ................. G01R 33/0322
385/12

(Continued)

FOREIGN PATENT DOCUMENTS

CN    110133546 A * 8/2019 ......... G01R 33/0206

*Primary Examiner* — Christopher P McAndrew

(57) ABSTRACT

A chip-type three-dimensional magnetic field sensor includes a light source (1), an input straight waveguide (2), a polarization beam splitting waveguide (3), a 1:1 power beam splitter (4), three 1:2 type Y waveguides, three 2:1 type Y waveguides, three output straight waveguides, three magneto-optical waveguides and three photodetectors. The light source (1) outputs broad-spectrum depolarized light into the input straight waveguide (2), and then the light is divided into TE (transverse electric) polarized light and TM (transverse magnetic) polarized light. The TE polarized light is divided into two beams of TE polarized branch light. The TM polarized light is divided into two beams of TM polarized branch light. One of the two beams of TM polarized branch light is divided into two beams of first TM polarized sub-branch light. Another of the two beams of TM polarized branch light is divided into two beams of second TM polarized sub-branch light.

7 Claims, 3 Drawing Sheets

(58) Field of Classification Search
USPC .......................................................... 324/244
See application file for complete search history.

(56) References Cited

U.S. PATENT DOCUMENTS

| | | | |
|---|---|---|---|
| 10,754,091 B1* | 8/2020 | Nagarajan | G02B 6/428 |
| 11,119,219 B1* | 9/2021 | LaChapelle | G01S 17/26 |
| 2004/0175174 A1* | 9/2004 | Suhami | G02F 7/00 |
| | | | 398/43 |
| 2017/0163000 A1* | 6/2017 | Evans | H01S 5/1028 |
| 2018/0267340 A1* | 9/2018 | Rohde | G02F 1/225 |
| 2022/0003936 A1* | 1/2022 | Wang | B81B 3/0018 |
| 2022/0113482 A1* | 4/2022 | Nakamura | G02F 1/295 |

* cited by examiner

CHIP-TYPE THREE-DIMENSIONAL MAGNETIC FIELD SENSOR

CROSS REFERENCE OF RELATED APPLICATION

This is a U.S. National Stage under 35 U.S.C 371 of the International Application PCT/CN2020/086127, filed Apr. 22, 2020, which claims priority under 35 U.S.C. 119(a-d) to CN 201910391741.X, filed May 13, 2019.

BACKGROUND OF THE PRESENT INVENTION

Field of Invention

The present invention relates to the field of integrated optical and magnetic field sensing technology, and more particularly to a chip-type three-dimensional magnetic field sensor.

Description of Related Arts

Magnetic field sensors play an important role in many fields such as daily transportation, geophysics, military defense, and biomedicine. For example, the aircraft adopts magnetic field sensors to realize highly reliable contactless information exchange, so as to ensure the flight safety; all kinds of mine resources such as steel, rare metals and non-ferrous metals are able to be located by magnetic field sensors, thereby greatly reducing the cost of prospecting; by detecting the geomagnetic field distribution in the territorial sea and comparing the original geomagnetic field data, it is able to be inferred whether there is a nuclear submarine nearby to ensure national security; the high-sensitivity magnetic field sensor is even able to scan the human heart and brain waves and draw the heart and brain electromagnetic map to assist medical diagnosis.

After people's continuous exploration, a large number of different types of magnetic field sensors have been developed and put into use. Throughout all magnetic field sensors, the magnetic field sensitivity of Hall devices and magnetoresistive sensors is relatively low, and the magnetic field sensitivity of coil sensors, fluxgates, proton magnetometers, optical pumps and superconducting quantum interferometers is high and above $10^{-9}$ T. Among high-sensitivity magnetic field sensors, coil sensors have certain limitations, and are only able to measure dynamically changing magnetic fields with high change rate, but are unable to measure digital current (DC) magnetic fields or magnetic fields with low change rate. Fluxgates and proton magnetometers are very serious in energy consumption, and are limited by their own principles in frequency, which are unable to adapt to the development trend of high frequency. Optical pumps are larger in size, more expensive, consume more energy (a few watts), and are inconvenient to maintain. Superconducting quantum interferometers are up to $10^{-15}$ T in sensitivity, but they require a low temperature and harsh environment and are only able to be used in the laboratory. With the continuous development of science and technology, people urgently need to develop more excellent magnetic field sensors with higher sensitivity, higher frequency, lower energy consumption, higher stability and smaller size.

SUMMARY OF THE PRESENT INVENTION

In order to solve the problems in the background art, the present invention provides a chip-type three-dimensional magnetic field sensor with three-axis monolithic integration, high integration, small size, simple preparation process, and easy packaging.

The present invention adopts technical solutions as follows.

A chip-type three-dimensional magnetic field sensor comprises a light source, an input straight waveguide, a polarization beam splitting waveguide, a 1:1 power beam splitter, three 1:2 type Y waveguides, three 2:1 type Y waveguides, three output straight waveguides, three magneto-optical waveguides and three photodetectors, wherein the three 1:2 type Y waveguides are a first 1:2 type Y waveguide, a second 1:2 type Y waveguide and a third 1:2 type Y waveguide, respectively; the three 2:1 type Y waveguides are a first 2:1 type Y waveguide, a second 2:1 type Y waveguide and a third 2:1 type Y waveguide, respectively; the three output straight waveguides are a first output straight waveguide, a second output straight waveguide and a third output straight waveguide, respectively; the three magneto-optical waveguides are a first magneto-optical waveguide, a second magneto-optical waveguide and a third magneto-optical waveguide, respectively; the three photodetectors are a first photodetector, a second photodetector and a third photodetector, respectively;

the input straight waveguide is connected with an input end of the polarization beam splitting waveguide, a first output end of the polarization beam splitting waveguide is connected to the first photodetector as a first sensing axis through the first 1:2 type Y waveguide, the first 2:1 type Y waveguide and the first output straight waveguide in sequence; two output ends of the first 1:2 type Y waveguide are connected to two input ends of the first 2:1 type Y waveguide through the first magneto-optical waveguide and the first straight waveguide, respectively; a second output end of the polarization beam splitting waveguide is connected to an input end of the 1:1 power beam splitter; a first output end of the 1:1 power beam splitter is connected to a second photodetector as a second sensing axis through the second 1:2 type Y waveguide, the second 2:1 type Y waveguide and the second output straight waveguide in sequence; two output ends of the second 1:2 type Y waveguide are connected to two input ends of the second 2:1 type Y waveguide through the second magneto-optical waveguide and the second straight waveguide, respectively; a second output end of the 1:1 power beam splitter is connected to the third photodetector as a third sensing axis through the third 1:2 type Y waveguide, the third 2:1 type Y waveguide and the third output straight waveguide in sequence; two output ends of the third 1:2 type Y waveguide are connected to two input ends of the third 2:1 type Y waveguide through the third magneto-optical waveguide and the third straight waveguide, respectively; two first modulation electrodes are located at two sides of the first straight waveguide, respectively; two second modulation electrodes are located at two sides of the second straight waveguide, respectively; two third modulation electrodes are located at two sides of the third straight waveguide, respectively.

The light source outputs broad-spectrum depolarized light into the input straight waveguide, and then the light is divided into TE (transverse electric) polarized light and TM (transverse magnetic) polarized light through the polarization beam splitting waveguide, wherein both the TE polarized light and the TM polarized light propagate along a horizontal direction; the TE polarized light is divided into two beams of TE polarized branch light with same power through the first 1:2 type Y waveguide, wherein one of the two beams of TE polarized branch light passes through an upper branch of the first 1:2 type Y waveguide, the first magneto-optical waveguide, an upper branch of the first 2:1 type Y waveguide in sequence; another of the two beams of TE polarized branch light passes through a lower branch of the first 1:2 type Y waveguide, the first straight waveguide, a lower branch of the first 2:1 type Y waveguide in sequence; and then, the two beams of TE polarized branch light converge at a single port of the first 2:1 type Y waveguide, and finally are inputted to the first photodetector;

the TM polarized light is divided into two beams of TM polarized branch light with same power through the 1:1 power beam splitter; the two beams of TM polarized branch light propagate along a horizontal direction and a vertical direction, respectively; one of the two beams of TM polarized branch light, which propagates along the horizontal direction, is divided into two beams of first TM polarized sub-branch light with same power through the second 1:2 type Y waveguide, wherein one of the two beams of first TM polarized sub-branch light passes through an upper branch of the second 1:2 type Y waveguide, the second magneto-optical waveguide, an upper branch of the second 2:1 type Y waveguide in sequence; another of the two beams of first TM polarized sub-branch light passes through a lower branch of the second 1:2 type Y waveguide, the second straight waveguide, a lower branch of the second 2:1 type Y waveguide in sequence; the two beams of first TM polarized sub-branch light converge at a single port of the second 2:1 type Y waveguide, and finally are inputted to the second photodetector; another of the two beams of TM polarized branch light, which propagates along the vertical direction, is divided into two beams of second TM polarized sub-branch light with same power through the third 1:2 type Y waveguide, wherein one of the two beams of second TM polarized sub-branch light passes through a left branch of the third 1:2 type Y waveguide, the third straight waveguide, a left branch of the third 2:1 type Y waveguide in sequence; another of the two beams of second TM polarized sub-branch light passes through a right branch of the third 1:2 type Y waveguide, the third magneto-optical waveguide, a right branch of the third 2:1 type Y waveguide in sequence; the two beams of second TM polarized sub-branch light converge at a single port of the third 2:1 type Y waveguide, and finally are inputted to the third photodetector.

All of the input straight waveguide, the polarization beam splitting waveguide, the 1:1 power beam splitter, the first 1:2 type Y waveguide, the first straight waveguide, the first 2:1 type Y waveguide, the first output straight waveguide, the second 1:2 type Y waveguide, the second straight waveguide, the second 2:1 type Y waveguide, the second output straight waveguide, the third 1:2 type Y waveguide, the third straight waveguide, the third 2:1 type Y waveguide and the third output straight waveguide are ridge waveguides and integrated on a surface of a lithium niobate single crystal thin film layer; the lithium niobate single crystal thin film layer is located on an upper surface of a silica buffer layer, the silica buffer layer is located on an upper surface of a silicon substrate and sandwiched between the lithium niobate single crystal thin film layer and the silicon substrate.

All of the first modulation electrode, the second modulation electrode and the third modulation electrode are provided on an upper surface of the lithium niobate single crystal thin film layer.

Each of the first magneto-optical waveguide, the second magneto-optical waveguide and the third magneto-optical waveguide comprises an upper cladding, a lower cladding and a core layer sandwiched between the upper cladding and the lower cladding; the core layer of the first magneto-optical waveguide is formed by bonding a magneto-optical material with a lithium niobate material, the upper cladding and the lower cladding of the first magneto-optical waveguide are made from a silica material; the core layer of the second magneto-optical waveguide and that of the third magneto-optical waveguide are made from the lithium niobate material, the upper cladding of the second magneto-optical waveguide and that of the third magneto-optical waveguide are made from the magneto-optical material, the lower cladding of the second magneto-optical waveguide and that of the third magneto-optical waveguide are made from a silica material.

The first magneto-optical waveguide, the second magneto-optical waveguide and the third magneto-optical waveguide sense magnetic field strength in three different directions in a three-dimensional coordinate axis, wherein the first magneto-optical waveguide senses the magnetic field strength in X-direction, the second magneto-optical waveguide senses the magnetic field strength in Z-direction, and the third magneto-optical waveguide senses the magnetic field strength in Y-direction.

The light source is an ASE (amplified spontaneous emission) light source or a SLD (superluminescent diode) light source, an optical path of all the three sensing axes adopts a symmetrical structure of Machzand interferometer, two interference arms are of equal length.

The present invention has some beneficial effects as follows.

(1) The present invention adopts the broad-spectrum light source, the optical path of all the three sensing axes adopts a symmetrical structure of Machzand interferometer, two interference arms are of equal length, the phase difference of the two interference arms caused by magnetic field is detected, which is not affected by the fluctuation of light intensity of the light source, thereby effectively avoiding the error caused by parasitic effect in the optical system. Moreover, the optical noise is small.

(2) The three-dimensional magnetic field sensor provided by the present invention has three-axis monolithic integration, high integration, small size, simple preparation process, and easy packaging, which is suitable for mass production.

Figure 1:
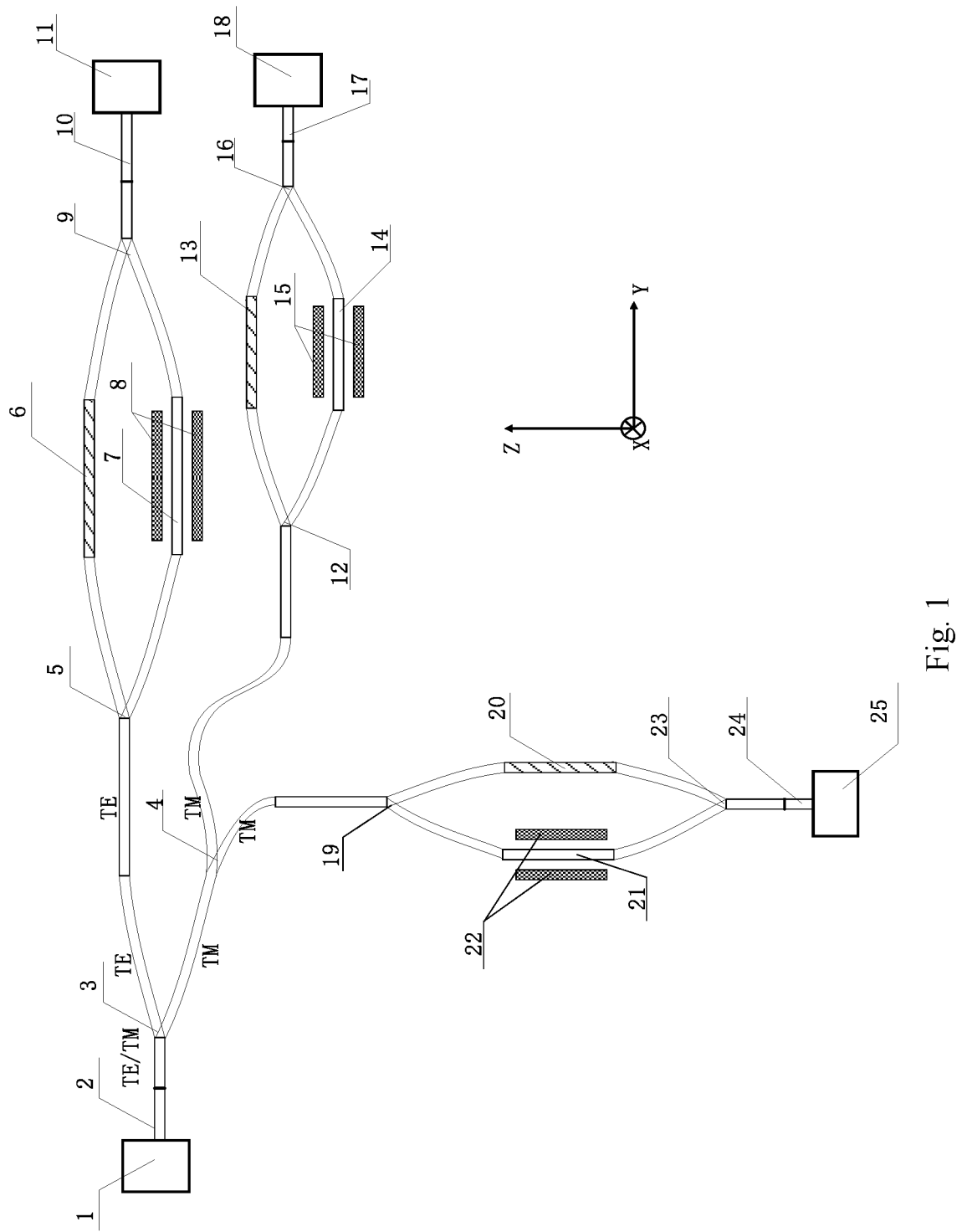
FIG. 1 is a structurally schematic view of the present invention.

In the drawings, 1: light source; 2: input straight waveguide; 3: polarization beam splitting waveguide; 4: 1:1 power beam splitter; 5: first 1:2 type Y waveguide; 6: first magneto-optical waveguide; 7: first straight waveguide; 8: first modulation electrode; 9: first 2:1 type Y waveguide; 10: first output straight waveguide; 11: first photodetector; 12: second 1:2 type Y waveguide; 13: second magneto-optical waveguide; 14: second straight waveguide; 15: second modulation electrode; 16: second 2:1 type Y waveguide; 17: second output straight waveguide; 18: second photodetector; 19: third 1:2 type Y waveguide; 20: third magneto-optical waveguide; 21: third straight waveguide; 22: third modulation electrode; 23: third 2:1 type Y waveguide; 24: third output straight waveguide; 25: third photodetector; 26: lithium niobate single crystal thin film layer; 27: silica buffer layer; 28: silicon substrate; 29: magneto-optical material; 30: air; 31: lithium niobate material; 32: silica material.

DETAILED DESCRIPTION OF THE
PREFERRED EMBODIMENT

The present invention is further explained in combination with drawings and embodiments as follows.

Referring to FIG. 1, a chip-type three-dimensional magnetic field sensor provided by the present invention comprises a light source 1, an input straight waveguide 2, a polarization beam splitting waveguide 3, a 1:1 power beam splitter 4, three 1:2 type Y waveguides, three 2:1 type Y waveguides, three output straight waveguides, three magneto-optical waveguides and three photodetectors. The input straight waveguide 2 is connected with an input end of the polarization beam splitting waveguide 3, a first output end of the polarization beam splitting waveguide 3 is connected to the first photodetector 11 through a first 1:2 type Y waveguide 5, a first 2:1 type Y waveguide 9 and a first output straight waveguide 10 in sequence; two output ends of the first 1:2 type Y waveguide 5 are connected to two input ends of the first 2:1 type Y waveguide 9 through a first magneto-optical waveguide 6 and a first straight waveguide 7, respectively; a second output end of the polarization beam splitting waveguide 3 is connected to an input end of the 1:1 power beam splitter 4; a first output end of the 1:1 power beam splitter 4 is connected to a second photodetector 18 through a second 1:2 type Y waveguide 12, a second 2:1 type Y waveguide 16 and a second output straight waveguide 17 in sequence; two output ends of the second 1:2 type Y waveguide 12 are connected to two input ends of the second 2:1 type Y waveguide 16 through a second magneto-optical waveguide 13 and a second straight waveguide 14, respectively; a second output end of the 1:1 power beam splitter 4 is connected to a third photodetector 25 through a third 1:2 type Y waveguide 19, a third 2:1 type Y waveguide 23 and a third output straight waveguide 24 in sequence; two output ends of the third 1:2 type Y waveguide 19 are connected to two input ends of the third 2:1 type Y waveguide 23 through a third magneto-optical waveguide 20 and a third straight waveguide 21, respectively; two first modulation electrodes 8 are located at two sides of the first straight waveguide 7, respectively; two second modulation electrodes 15 are located at two sides of the second straight waveguide 14, respectively; two third modulation electrodes 22 are located at two sides of the third straight waveguide 21, respectively.

The light source 1 outputs broad-spectrum depolarized light into the input straight waveguide 2, and then the light is divided into TE (transverse electric) polarized light and TM (transverse magnetic) polarized light through the polarization beam splitting waveguide 3, wherein both the TE polarized light and the TM polarized light propagate along a horizontal direction; the TE polarized light is divided into two beams of TE polarized branch light with same power through the first 1:2 type Y waveguide 5, wherein one of the two beams of TE polarized branch light passes through an upper branch of the first 1:2 type Y waveguide 5, the first magneto-optical waveguide 6, an upper branch of the first 2:1 type Y waveguide 9 in sequence; another of the two beams of TE polarized branch light passes through a lower branch of the first 1:2 type Y waveguide 5, the first straight waveguide 7, a lower branch of the first 2:1 type Y waveguide 9 in sequence; and then, the two beams of TE polarized branch light converge at a single port of the first 2:1 type Y waveguide 9, and finally are inputted to the first photodetector 11; the TM polarized light is divided into two beams of TM polarized branch light with same power through the 1:1 power beam splitter 4; the two beams of TM polarized branch light propagate along a positive Y direction and a negative Z direction, respectively; one of the two beams of TM polarized branch light, which propagates along the positive Y direction, is divided into two beams of first TM polarized sub-branch light with same power through the second 1:2 type Y waveguide 12, wherein one of the two beams of first TM polarized sub-branch light passes through an upper branch of the second 1:2 type Y waveguide 12, the second magneto-optical waveguide 13, an upper branch of the second 2:1 type Y waveguide 16 in sequence; another of the two beams of first TM polarized sub-branch light passes through a lower branch of the second 1:2 type Y waveguide 12, the second straight waveguide 14, a lower branch of the second 2:1 type Y waveguide 16 in sequence; the two beams of first TM polarized sub-branch light converge at a single port of the second 2:1 type Y waveguide 16, and finally are inputted to the second photodetector 18; another of the two beams of TM polarized branch light, which propagates along the negative Z direction, is divided into two beams of second TM polarized sub-branch light with same power through the third 1:2 type Y waveguide 19, wherein one of the two beams of second TM polarized sub-branch light passes through a left branch of the third 1:2 type Y waveguide 19, the third straight waveguide 21, a left branch of the third 2:1 type Y waveguide 23 in sequence; another of the two beams of second TM polarized sub-branch light passes through a right branch of the third 1:2 type Y waveguide 19, the third magneto-optical waveguide 20, a right branch of the third 2:1 type Y waveguide 23 in sequence; the two beams of second TM polarized sub-branch light converge at a single port of the third 2:1 type Y waveguide 23, and finally are inputted to the third photodetector 25.

Figure 2:
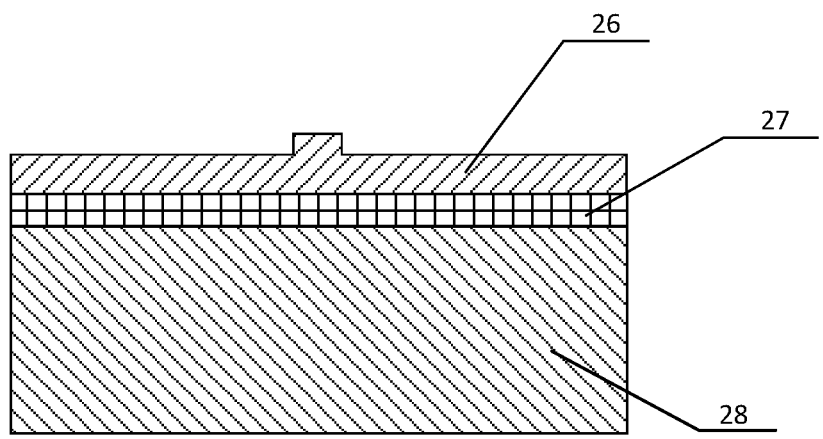
FIG. 2 is a sectional diagram of a ridge waveguide.

As shown in FIG. 2, all of the input straight waveguide 2, the polarization beam splitting waveguide 3, the 1:1 power beam splitter 4, the first 1:2 type Y waveguide 5, the first straight waveguide 7, the first 2:1 type Y waveguide 9, the first output straight waveguide 10, the second 1:2 type Y waveguide 12, the second straight waveguide 14, the second 2:1 type Y waveguide 16, the second output straight waveguide 17, the third 1:2 type Y waveguide 19, the third straight waveguide 21, the third 2:1 type Y waveguide 23 and the third output straight waveguide 24 are ridge waveguides and integrated on a surface of a lithium niobate single crystal thin film layer 26; the lithium niobate single crystal thin film layer 26 is located on an upper surface of a silica buffer layer 27, the silica buffer layer 27 is located on an upper surface of a silicon substrate 28. The silicon substrate 28 has a thickness in a range of 0.2 mm to 1 mm, the silica buffer layer has a thickness in a range of 1 µm to 10 µm, the lithium niobate single crystal thin film layer has a thickness in a range of 0.2 µm to 2 µm.

All of the first modulation electrode 8, the second modulation electrode 15 and the third modulation electrode 22 are formed on an upper surface of the lithium niobate single crystal thin film layer 26.

Figure 3:
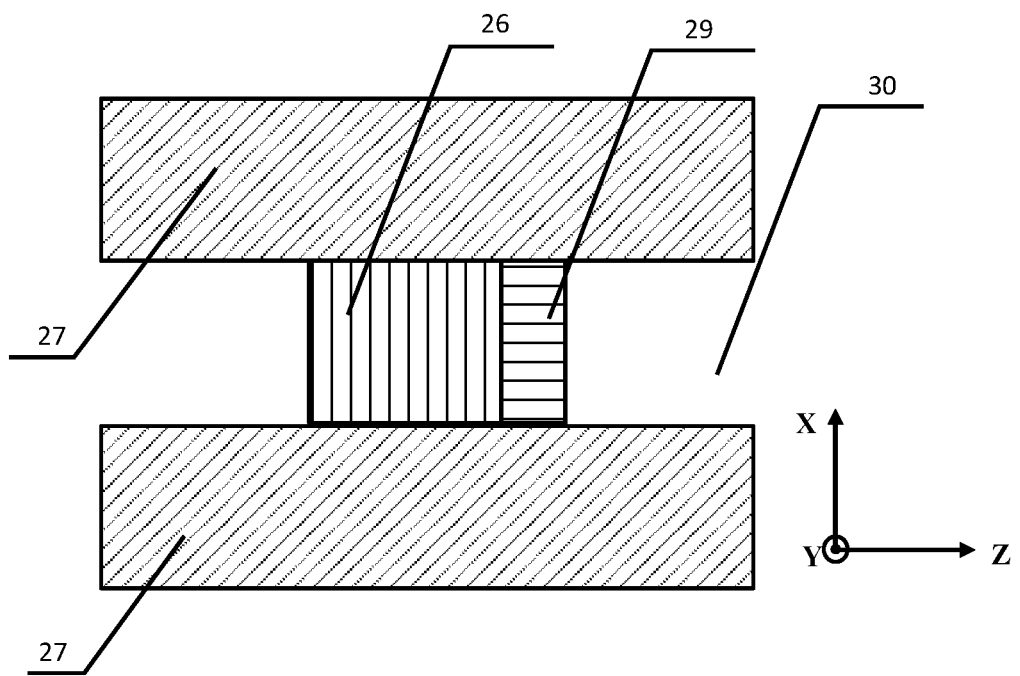
FIG. 3 is a sectional diagram of a first magneto-optical waveguide.
Figure 4:
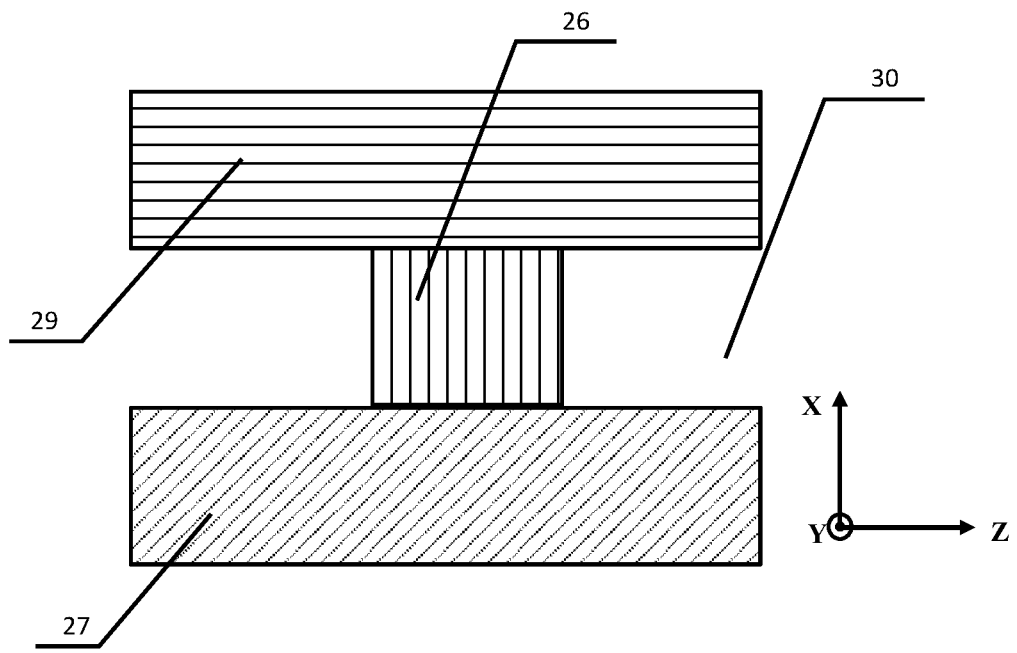
FIG. 4 is a sectional diagram of a second magneto-optical waveguide.
Figure 5:
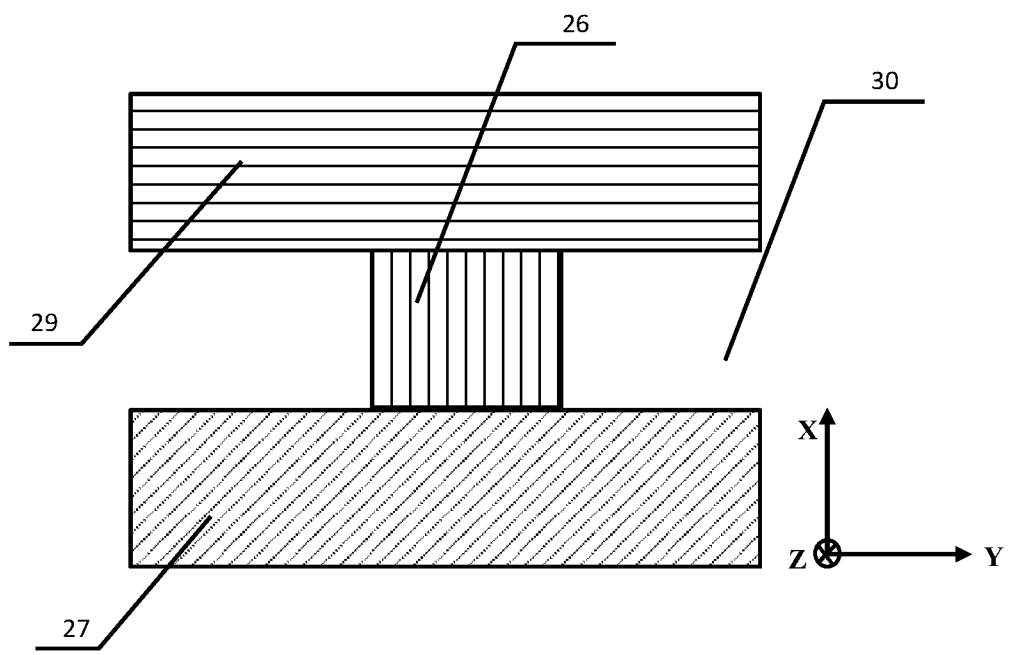
FIG. 5 is a sectional diagram of a third magneto-optical waveguide.

Referring to FIGS. 3-5, the first magneto-optical waveguide 6, the second magneto-optical waveguide 13 and the third magneto-optical waveguide 20 are arranged along coordinate directions shown in FIGS. 3-5, respectively; and the first magneto-optical waveguide 6, the second magneto-optical waveguide 13 and the third magneto-optical waveguide 20 are sensitive to an X direction magnetic field, a Y direction magnetic field and a Z direction magnetic field, respectively. Each of the first magneto-optical waveguide 6, the second magneto-optical waveguide 13 and the third magneto-optical waveguide 20 comprises an upper cladding, a lower cladding and a core layer sandwiched between the upper cladding and the lower cladding; the core layer of the first magneto-optical waveguide 6 is formed by bonding a magneto-optical material 29 with a lithium niobate material 31, the upper cladding and the lower cladding of the first magneto-optical waveguide 6 are made from a silica material 32; the core layer of the second magneto-optical waveguide 13 and that of the third magneto-optical waveguide 20 are made from the lithium niobate material 31, the upper cladding of the second magneto-optical waveguide 13 and that of the third magneto-optical waveguide 20 are made from the magneto-optical material 29, the lower cladding of the second magneto-optical waveguide 13 and that of the third magneto-optical waveguide 20 are made from a silica material; the second magneto-optical waveguide 13 is along Y direction, the third magneto-optical waveguide 20 is along Z direction. The first magneto-optical waveguide 6 senses a magnetic field strength in the X direction, the second magneto-optical waveguide 13 senses a magnetic field strength in the Z direction, and the third magneto-optical waveguide 20 senses a magnetic field strength in the Y direction.

Embodiment

The light source for outputting broad-spectrum depolarized light provided by the present invention is embodied as an ASE (amplified spontaneous emission) light source with an output power of 5 mw, a center wavelength of 1550 nm, and a 3 dB half-height spectrum width of 40 nm. The silica substrate 28 has a thickness of 0.5 mm, the silica buffer layer 27 has a thickness of 2 µm, and the lithium niobate single crystal thin film layer 26 has a thickness of 0.6 µm. The magneto-optical material 29 uses cerium-doped yttrium iron garnet (Ce:YIG), an Faraday rotation angle $\theta_F$ of Ce:YIG is $7.0\times10^{-3}$ µm, a magneto-optical coefficient $f_1=-8.63\times10^{-8}$ A/m, a saturation magnetization $M_s$ reaches 95.5 kA/m, and an effective refractive index $n_{Ce:YIG}=2.22$.

All of the input straight waveguide, the polarization beam splitting waveguide, the 1:1 power beam splitter, the first 1:2 type Y waveguide, the first straight waveguide, the first 2:1 type Y waveguide, the first output straight waveguide, the second 1:2 type Y waveguide, the second straight waveguide, the second 2:1 type Y waveguide, the second output straight waveguide, the third 1:2 type Y waveguide, the third straight waveguide, the third 2:1 type Y waveguide and the third output straight waveguide are ridge waveguides with a waveguide width of 0.8 µm and a ridge height of 0.3 µm. Each of the first modulation electrode, the second modulation electrode and the third modulation electrode have a length of 10 mm, a distance between each of the first modulation electrode, the second modulation electrode and the third modulation electrode and the corresponding ridge waveguide is 2 µm. All of the first magneto-optical waveguide, the second magneto-optical waveguide and the third magneto-optical waveguide have a length of 10 mm. The first magneto-optical waveguide senses the magnetic field strength in the X direction, the second magneto-optical waveguide senses the magnetic field strength in the Z direction, and the third magneto-optical waveguide senses the magnetic field strength in the Y direction.

What is claimed is:

1. A chip-type three-dimensional magnetic field sensor, comprising a light source, an input straight waveguide, a polarization beam splitting waveguide, a 1:1 power beam splitter, three 1:2 type Y waveguides, three 2:1 type Y waveguides, three output straight waveguides, three magneto-optical waveguides and three photodetectors, wherein:

the input straight waveguide is connected with an input end of the polarization beam splitting waveguide, a first output end of the polarization beam splitting waveguide is connected to a first photodetector as a first sensing axis through a first 1:2 type Y waveguide, a first 2:1 type Y waveguide and a first output straight waveguide in sequence;

two output ends of the first 1:2 type Y waveguide are connected to two input ends of the first 2:1 type Y waveguide through a first magneto-optical waveguide and a first straight waveguide, respectively; a second output end of the polarization beam splitting waveguide is connected to an input end of the 1:1 power beam splitter;

a first output end of the 1:1 power beam splitter is connected to a second photodetector as a second sensing axis through a second 1:2 type Y waveguide, a second 2:1 type Y waveguide and a second output straight waveguide in sequence; two output ends of the second 1:2 type Y waveguide are connected to two input ends of the second 2:1 type Y waveguide through a second magneto-optical waveguide and a second straight waveguide, respectively;

a second output end of the 1:1 power beam splitter is connected to a third photodetector as a third sensing axis through a third 1:2 type Y waveguide, a third 2:1 type Y waveguide and a third output straight waveguide in sequence;

two output ends of the third 1:2 type Y waveguide are connected to two input ends of the third 2:1 type Y waveguide through a third magneto-optical waveguide and a third straight waveguide, respectively; two first modulation electrodes are located at two sides of the first straight waveguide, respectively; two second modulation electrodes are located at two sides of the second straight waveguide, respectively; two third modulation electrodes are located at two sides of the third straight waveguide, respectively.

2. The chip-type three-dimensional magnetic field sensor according to claim 1, wherein:

the light source outputs broad-spectrum depolarized light into the input straight waveguide, and then the light is divided into TE (transverse electric) polarized light and TM (transverse magnetic) polarized light through the polarization beam splitting waveguide, wherein both the TE polarized light and the TM polarized light propagate along a horizontal direction;

the TE polarized light is divided into two beams of TE polarized branch light with same power through the first 1:2 type Y waveguide, wherein one of the two beams of TE polarized branch light passes through an upper branch of the first 1:2 type Y waveguide, the first magneto-optical waveguide, an upper branch of the first 2:1 type Y waveguide in sequence; another of the two beams of TE polarized branch light passes through a lower branch of the first 1:2 type Y waveguide, the first straight waveguide, a lower branch of the first 2:1 type Y waveguide in sequence; and then, the two beams of TE polarized branch light converge at a single port of the first 2:1 type Y waveguide, and finally are inputted to the first photodetector;

the TM polarized light is divided into two beams of TM polarized branch light with same power through the 1:1 power beam splitter; the two beams of TM polarized branch light propagate along a horizontal direction and a vertical direction, respectively; one of the two beams of TM polarized branch light, which propagates along the horizontal direction, is divided into two beams of first TM polarized sub-branch light with same power through the second 1:2 type Y waveguide, wherein one of the two beams of first TM polarized sub-branch light passes through an upper branch of the second 1:2 type Y waveguide, the second magneto-optical waveguide, an upper branch of the second 2:1 type Y waveguide in sequence; another of the two beams of first TM polarized sub-branch light passes through a lower branch of the second 1:2 type Y waveguide, the second straight waveguide, a lower branch of the second 2:1 type Y waveguide in sequence; the two beams of first TM polarized sub-branch light converge at a single port of the second 2:1 type Y waveguide, and finally are inputted to the second photodetector;

another of the two beams of TM polarized branch light, which propagates along the vertical direction, is divided into two beams of second TM polarized sub-branch light with same power through the third 1:2 type Y waveguide, wherein one of the two beams of second TM polarized sub-branch light passes through a left branch of the third 1:2 type Y waveguide, the third straight waveguide, a left branch of the third 2:1 type Y waveguide in sequence; another of the two beams of second TM polarized sub-branch light passes through a right branch of the third 1:2 type Y waveguide, the third magneto-optical waveguide, a right branch of the third 2:1 type Y waveguide in sequence; the two beams of second TM polarized sub-branch light converge at a single port of the third 2:1 type Y waveguide, and finally are inputted to the third photodetector.

3. The chip-type three-dimensional magnetic field sensor according to claim 1, wherein all of the input straight waveguide, the polarization beam splitting waveguide, the 1:1 power beam splitter, the first 1:2 type Y waveguide, the first straight waveguide, the first 2:1 type Y waveguide, the first output straight waveguide, the second 1:2 type Y waveguide, the second straight waveguide, the second 2:1 type Y waveguide, the second output straight waveguide, the third 1:2 type Y waveguide, the third straight waveguide, the third 2:1 type Y waveguide and the third output straight waveguide are ridge waveguides and integrated on a surface of a lithium niobate single crystal thin film layer; the lithium niobate single crystal thin film layer is located on an upper surface of a silica buffer layer, the silica buffer layer is located on an upper surface of a silicon substate and sandwiched between the lithium niobate single crystal thin film layer and the silicon substrate.

4. The chip-type three-dimensional magnetic field sensor according to claim 3, wherein all of the first modulation electrode, the second modulation electrode and the third modulation electrode are provided on an upper surface of the lithium niobate single crystal thin film layer.

5. The chip-type three-dimensional magnetic field sensor according to claim 1, wherein each of the first magneto-optical waveguide, the second magneto-optical waveguide and the third magneto-optical waveguide comprises an upper cladding, a lower cladding and a core layer sandwiched between the upper cladding and the lower cladding; the core layer of the first magneto-optical waveguide is formed by bonding a magneto-optical material with a lithium niobate material, the upper cladding and the lower cladding of the first magneto-optical waveguide are made from a silica material; the core layer of the second magneto-optical waveguide and that of the third magneto-optical waveguide are made from the lithium niobate material, the upper cladding of the second magneto-optical waveguide and that of the third magneto-optical waveguide are made from the magneto-optical material, the lower cladding of the second magneto-optical waveguide and that of the third magneto-optical waveguide are made from a silica material.

6. The chip-type three-dimensional magnetic field sensor according to claim 5, wherein the first magneto-optical waveguide, the second magneto-optical waveguide and the third magneto-optical waveguide sense magnetic field strength in three different directions in a three-dimensional coordinate axis.

7. The chip-type three-dimensional magnetic field sensor according to claim 1, wherein the light source is an ASE (amplified spontaneous emission) light source or a SLD (superluminescent diode) light source, an optical path of all the three sensing axes adopts a symmetrical structure of Machzand interferometer, two interference arms are of equal length.

* * * * *